(12) United States Patent
Kim

(10) Patent No.: US 9,905,603 B1
(45) Date of Patent: Feb. 27, 2018

(54) SUCCESSIVE APPROXIMATION REGISTER ANALOG-TO-DIGITAL CONVERTER, CMOS IMAGE SENSOR INCLUDING THE SAME AND OPERATING METHOD THEREOF

(71) Applicant: SK hynix Inc., Gyeonggi-do (KR)

(72) Inventor: Tae-Gyu Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/596,014

(22) Filed: May 16, 2017

(30) Foreign Application Priority Data

Sep. 1, 2016 (KR) .......................... 10-2016-0112433

(51) Int. Cl.
| | |
|---|---|
| H03M 1/12 | (2006.01) |
| H01L 27/146 | (2006.01) |
| H03M 1/00 | (2006.01) |
| H04N 5/374 | (2011.01) |

(52) U.S. Cl.
CPC .. *H01L 27/14643* (2013.01); *H01L 27/14609* (2013.01); *H03M 1/001* (2013.01); *H04N 5/374* (2013.01)

(58) Field of Classification Search
CPC ........ H01L 27/14643; H01L 27/14609; H04N 5/374; H03M 1/001
USPC .................................................. 341/155, 172
See application file for complete search history.

(56) References Cited

U.S. PATENT DOCUMENTS

| | | | | |
|---|---|---|---|---|
| 5,907,299 A | * | 5/1999 | Green ..................... | H03M 3/02 341/143 |
| 8,427,355 B2 | * | 4/2013 | Sin ...................... | H03M 1/1225 324/658 |
| 8,581,761 B1 | | 11/2013 | Bahukhandi et al. | |
| 9,584,144 B1 | * | 2/2017 | Zhou .................. | H03K 5/15026 |
| 9,602,116 B1 | * | 3/2017 | Le ....................... | H03M 1/0604 |

FOREIGN PATENT DOCUMENTS

KR   1020150122284   11/2015

* cited by examiner

*Primary Examiner* — Brian Young
(74) *Attorney, Agent, or Firm* — IP & T Group LLP

(57) ABSTRACT

A complementary metal oxide semiconductor (CMOS) image sensor includes a pixel array suitable for outputting a pixel signal corresponding to incident light; a row decoder suitable for selecting and controlling pixels in the pixel array by row lines; a tracking voltage generator suitable for generating a tracking voltage; a plurality of successive approximation register (SAR) analog-to-digital converters suitable for analog-to-digital converting a pixel signal by repeatedly performing N times (where N is a natural number representing desired resolution) a process of comparing the pixel signal generated by the pixel array with the tracking voltage generated by the tracking voltage generator and modulating the pixel signal; and a control unit suitable for controlling operations of the row decoder, the tracking voltage generator, and the plurality of SAR analog-to-digital converters.

12 Claims, 6 Drawing Sheets

1

SUCCESSIVE APPROXIMATION REGISTER ANALOG-TO-DIGITAL CONVERTER, CMOS IMAGE SENSOR INCLUDING THE SAME AND OPERATING METHOD THEREOF

CROSS-REFERENCE TO RELATED APPLICATION

The present application claims priority of Korean Patent Application No. 10-2016-0112433 filed on Sep. 1, 2016, which is incorporated herein by reference in its entirety.

TECHNICAL FIELD

Exemplary embodiments of the present disclosure relate to a complementary metal oxide semiconductor (CMOS) image sensor, and more particularly, to a successive approximation register (SAR) analog-to-digital converter capable of converting data by repeatedly performing a process of converting or storing data by operating phases using two comparators until having desired resolution, a CMOS image sensor including the same and an operating method thereof.

DISCUSSION OF THE RELATED ART

In designing a column parallel readout type CMOS image sensor (CIS), a SAR analog-to-digital converter (ADC) has been recently researched as an alternative to the single-slope ADC which is currently widely used. The SAR analog-to-digital converter could offer higher resolution and shorter analog-to-digital converting times than the single-slope ADC.

However, despite these and other excellent characteristics of a SAR analog-to-digital converter, using it in a CIS also requires that a separate independent digital-to-analog converter (DAC) is employed for each column line of the CIS.

Hence, at present, the SAR analog-to-digital converter cannot be applied in a CIS which has numerous column lines because using a DAC for each for the column lines is problematic.

SUMMARY

Various embodiments are directed to a SAR analog-to-digital converter, a complementary metal oxide semiconductor (CMOS) image sensor including the same and an operating method thereof.

The (SAR) analog-to-digital converter may perform an N-bit data conversion (N is a natural number representing a desired resolution) using a single tracking voltage generator by utilizing a structure of tracking a data value while modulating an input signal according to a calculation result.

The SAR analog-to-digital converter may perform data conversion by repeatedly performing by desired resolution, a process of converting or storing data depending on operating phases using two comparators.

The SAR analog-to-digital converter may reduce power consumption, switching noise, the size of a peripheral circuit, and operating speed of a CMOS image sensor including the same.

In an embodiment, complementary metal oxide semiconductor (CMOS) image sensor may include a pixel array suitable for outputting a pixel signal corresponding to incident light; a row decoder suitable for selecting and controlling pixels in the pixel array by row lines; a tracking voltage generator suitable for generating a tracking voltage; a plurality of successive approximation register (SAR) analog-to-digital converters suitable for analog-to-digital converting a pixel signal by repeatedly performing N times (where N is a natural number representing desired resolution) a process of comparing the pixel signal generated by the pixel array with the tracking voltage generated by the tracking voltage generator and modulating the pixel signal; and a control unit suitable for controlling operations of the row decoder, the tracking voltage generator, and the plurality of SAR analog-to-digital converters.

In an embodiment, a method of operating a complementary metal oxide semiconductor (CMOS) image sensor may include generating, during each of repetition processes, a tracking voltage modulated from a tracking voltage of a preceding repetition process at a predetermined rate, and analog-to-digital converting a pixel signal by repeatedly performing N times (where N is a natural number representing desired resolution) a process of comparing the pixel signal with the tracking voltage generated from the generating of the tracking voltage and modulating the pixel signal.

In an embodiment, a successive approximation register (SAR) analog-to-digital converting system may include a tracking voltage generator suitable for generating a tracking voltage; and a plurality of SAR analog-to-digital converter suitable for analog-to-digital converting an input signal by repeatedly performing N times (where N is a natural number representing desired resolution) a process of comparing the input signal with the tracking voltage generated by the tracking voltage generator and modulating the input signal.

In an embodiment, a successive approximation register (SAR) analog-to-digital converting method may include generating, during each of repetition processes, a tracking voltage modulated from a tracking voltage of a preceding repetition process at a predetermined rate; and analog-to-digital converting an input signal by repeatedly performing N times (where N is a natural number representing desired resolution) a process of comparing the input signal with the tracking voltage generated from the generating of the tracking voltage and modulating the input signal.

In an embodiment a successive approximation register (SAR) analog-to-digital converter may include an SAR analog-to-digital converting unit suitable for analog-to-digital converting an input signal by repeatedly performing N times (where N is a natural number representing desired resolution) a process of comparing the input signal with a tracking voltage and modulating the input signal; an output select unit suitable for selecting an output signal from the SAR analog-to-digital converting unit; and a feedback control unit suitable for outputting a feedback control signal to the SAR analog-to-digital converting unit according to the output signal selected by the output select unit.

In an embodiment, a successive approximation register (SAR) analog-to-digital converting method may include a first process of comparing an input signal with a first tracking voltage, and modulating or retaining the input signal depending on a first comparison result; and a second process of comparing the input signal modulated or retained during the first process with a second tracking voltage, and modulating or retaining, depending on a second comparison result, the input signal modulated or retained during the first process, wherein the first and second processes are repeatedly performed N/2 times using the input signal modulated or retained during the second process and tracking voltages of third to N-th repetition processes.

DETAILED DESCRIPTION

Figure 1A:
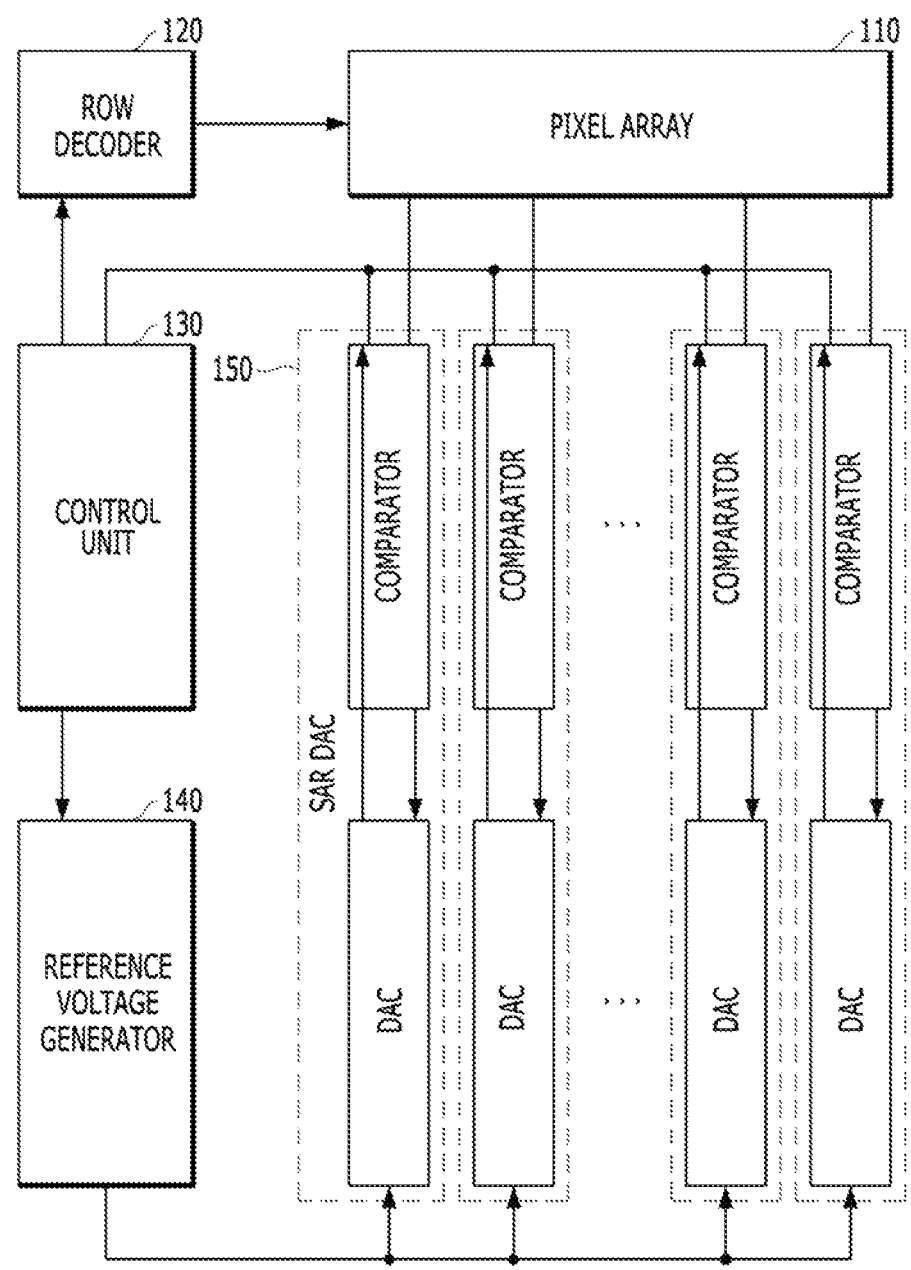
FIG. 1A is a diagram illustrating a CIS using a typical SAR analog-to-digital converter.

Various embodiments will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

It will be understood that when an element is referred to as being "coupled" to another element, it may be directly coupled to the element or electrically coupled thereto with other elements interposed therebetween. Furthermore, when an element is referred to as "comprising" or "including" a component, it does not preclude another component but may further include other components unless the context clearly indicates otherwise. The terminology used herein is for the purpose of describing particular embodiments only and is not intended to be limiting.

FIG. 1A is a diagram illustrating a configuration of a CIS using a typical SAR analog-to-digital converter.

Referring to FIG. 1A, the CIS using the typical SAR analog-to-digital converter may include a pixel array 110, a row decoder 120, a control unit 130, a reference voltage generator 140 and a plurality of SAR analog-to-digital converters 150. The pixel array 110 is suitable for outputting a pixel signal corresponding to incident light. The row decoder 120 is suitable for selecting pixels in the pixel array 110 by respective row lines and controlling operation of the pixels under control of the control unit 130 (e.g., a timing generator). The reference voltage generator 140 is suitable for generating a first reference voltage $+V_{REF}$ or $+V_{REF}/2^N$ or a second reference voltage $-V_{REF}$ or $-V_{REF}/2^N$ under control of the control unit 130. The plurality of SAR analog-to-digital converters 150 suitable for analog-to-digital converting the pixel signal outputted from the pixel array 110 in an SAR manner using the first reference voltage or the second reference voltage generated by the reference voltage generator 140 under control of the control unit 130. The control unit 130 is suitable for controlling the operations of the row decoder 120, the reference voltage generator 140, and the plurality of SAR analog-to-digital converters 150.

The SAR analog-to-digital converters 150 are provided in respective columns. Each of the SAR analog-to-digital converters 150 may include a comparator, a digital-to-analog converter (DAC). Hereinbelow, one example of the SAR analog-to-digital converter 150 will be described in detail with reference to FIGS. 1B and 1C.

Figure 1B:
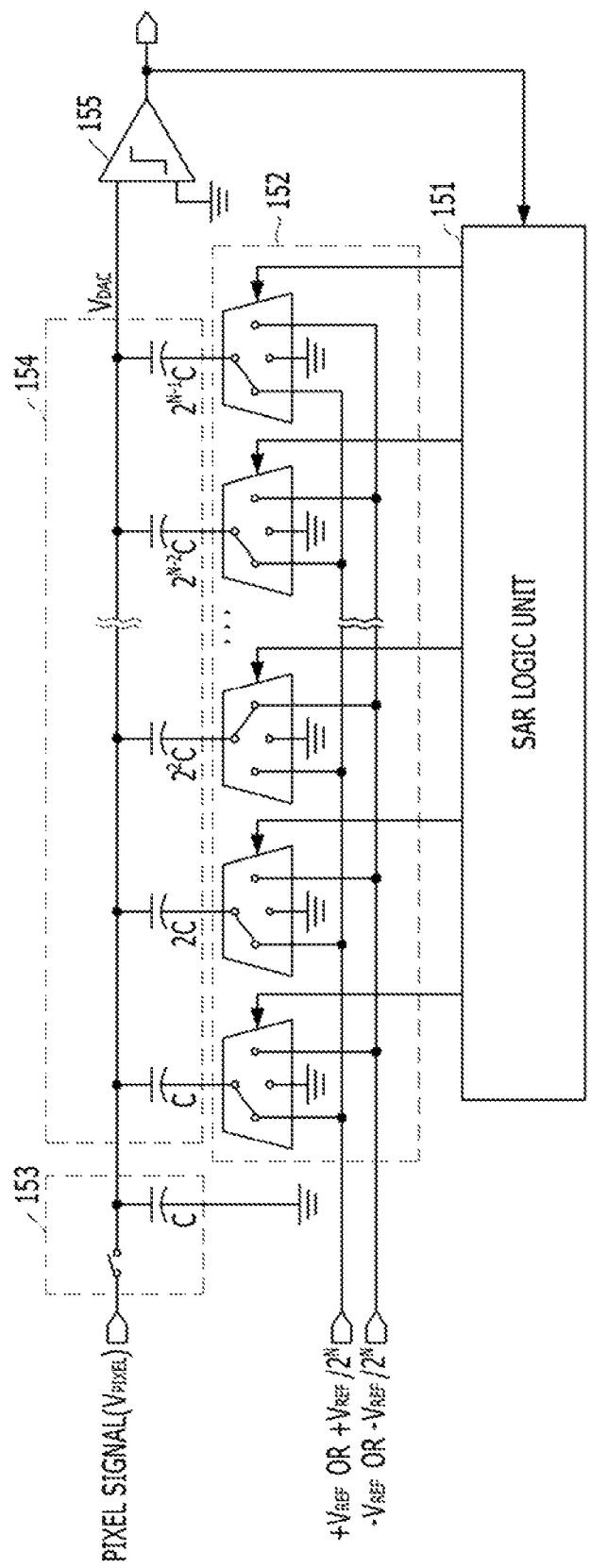
FIG. 1B is a diagram illustrating the SAR analog-to-digital converter of FIG. 1A.
Figure 1C:
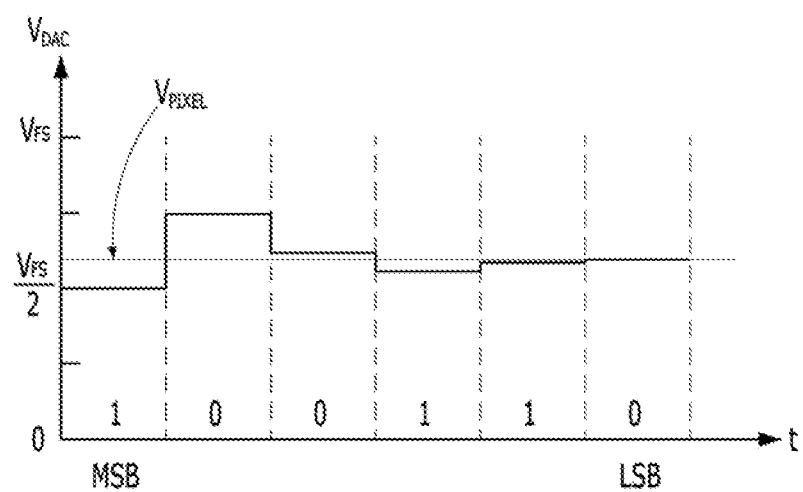
FIG. 1C is a diagram illustrating an input/output waveform of the SAR analog-to-digital converter of FIG. 1B.

FIG. 1B is a diagram illustrating the SAR analog-to-digital converter 150 of FIG. 1A, and FIG. 1C is a diagram illustrating an input/output waveform of the SAR analog-to-digital converter 150 of FIG. 1B.

Referring to FIG. 1B, the SAR analog-to-digital converter may include an SAR logic unit 151, a switch column 152, a sampling unit 153, a capacitor column 154 and a comparator 155. The SAR logic unit 151 is suitable for receiving an output signal fed back from the comparator 155 and providing a control signal according to a predetermined SAR logic. The switch column 152 is suitable for selecting the first reference voltage $+V_{REF}$ or $+V_{REF}/2^N$ or the second reference voltage $-V_{REF}$ or $-V_{REF}/2^N$ according to a control signal from the SAR logic unit 151 and transmitting the selected reference voltage to the capacitor column 154. The sampling unit 153 includes a sampling switch and a sampling capacitor, and is suitable for sampling a pixel signal $V_{PIXEL}$ received from the pixel array 110 according to a control signal of the control unit 130 and transmitting the sampled pixel signal to the comparator 155 through the capacitor column 154. The capacitor column 154 is coupled with an output of the switch column 152 and an output of the sampling unit 153. The comparator 155 is suitable for receiving an output $V_{DAC}$ of the capacitor column 154 and the pixel signal $V_{PIXEL}$, performing a comparison operation for the received signals, and outputting a result of the comparison operation. Here, the switch column 152 and the capacitor column 154 may form a digital-analog converting unit DAC.

The SAR analog-to-digital converter has several advantages, e.g., low power consumption. However, as shown in FIG. 1C, the SAR analog-to-digital converter makes the output $V_{DAC}$ (including MSB to LSB) of the digital-to-analog converting unit DAC meet a value (e.g., $V_{FS}/2$) converging on the pixel signal $V_{PIXEL}$ using the operations of the comparator 155 and the SAR logic unit 151 while maintaining the pixel signal $V_{PIXEL}$ as it is. Accordingly, to analog-to-digital convert the pixel signal of each column line, an independent digital-to-analog converter DAC should be provided.

In the case where the SAR analog-to-digital converter is applied to the CIS including numerous column lines, the digital-to-analog converter having a complex switch structure and a large number of capacitors should be independently provided for each of the numerous column lines. Therefore, there is currently a disadvantage in that it is cumbersome to employ the SAR analog-to-digital converter in the data conversion circuit of the CIS.

Furthermore, the SAR analog-to-digital converter may be disadvantageous in that a missing code may be caused by mismatch between capacitors, and an area thereof increases due to a complex circuit and a large number of elements which is at least several times to several tens of times larger than the number of elements in a typical signal-slope analog-to-digital converter.

To overcome the above disadvantages, the SAR analog-to-digital converter in accordance with an embodiment of the present invention uses a structure of tracking a data value while modulating an input signal according to a calculation result, and thus may perform an N-bit data converting operation using a single tracking voltage generator. That is, in the SAR analog-to-digital converter in accordance with an embodiment of the present invention, data conversion is performed by repeatedly performing, by desired resolution, a process of converting or storing data depending on operating phases using two comparators. Thereby, power consumption, switching noise, the size of peripheral circuit, and operation speed may be reduced.

Figure 2A:
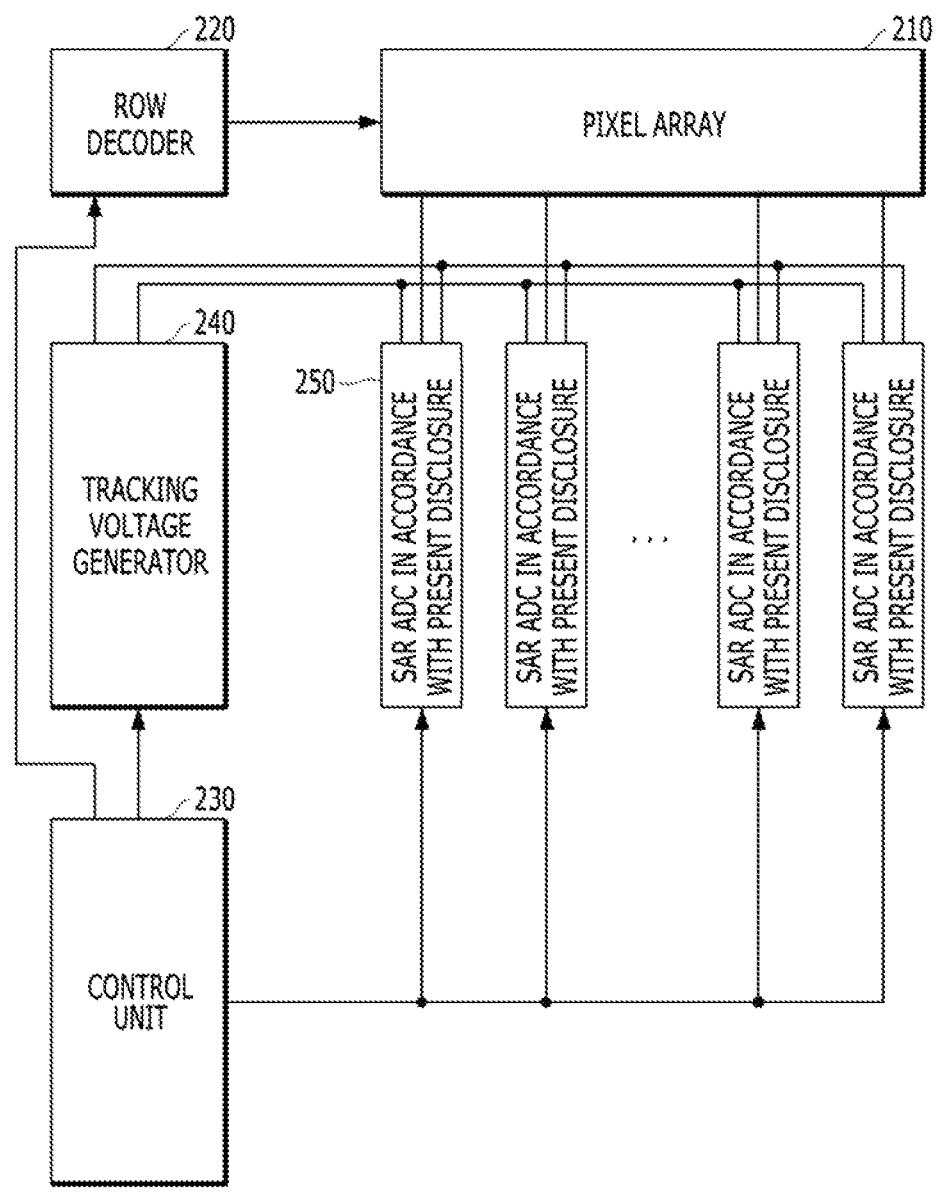
FIG. 2A is a diagram illustrating a CIS using a SAR analog-to-digital converter in accordance with an embodiment of the present invention.

FIG. 2A is a diagram illustrating configuration of a CIS using a SAR analog-to-digital converter in accordance with an embodiment of the present invention.

Referring to FIG. 2A, the CIS using the SAR analog-to-digital converter, in accordance with an embodiment of the present invention, may include a pixel array 210, a row decoder 220, a control unit 230, a tracking voltage generator 240 and a plurality of SAR analog-to-digital converters 250. The pixel array 210 is suitable for outputting a pixel signal corresponding to incident light. The row decoder 220 is suitable for selecting pixels in the pixel array 210 by respective row lines and controlling operation of the pixels under control of the control unit 230 (e.g., a timing generator). The tracking voltage generator 240 is suitable for generating a tracking voltage (e.g., a first tracking voltage $V_{TRA1}$ and a second tracking voltage $V_{TRA2}$) under control of the control unit 230. The plurality of SAR analog-to-digital converters 250 is suitable for analog-to-digital converting the pixel signal by repeatedly performing N times (where N is a natural number representing desired resolution) a process of comparing the pixel signal received from the pixel array 210 with the tracking voltage generated by the tracking voltage generator 240 and modulating the pixel signal under control of the control unit 230. The control unit 230 is suitable for controlling the operations of the row decoder 220, the reference voltage generator 240 and the plurality of SAR analog-to-digital converter 250.

Here, during each of the repetition processes which are successively performed, the tracking voltage generator 240 may generate a tracking voltage which is reduced (or modulated) at a predetermined rate (e.g., ½) compared to a tracking voltage of a preceding repetition process. For instance, in the case where the tracking voltage generator 240 generates a first tracking voltage $V_{TRA1}$ and a second tracking voltage $V_{TRA2}$, the tracking voltage generator 240 may generate a first tracking voltage having a predetermined voltage level during a first repetition process. During a second repetition process, the tracking voltage generator 240 may generate a second tracking voltage reduced to ½ of the first tracking voltage of the first repetition process. During a third repetition process, the tracking voltage generator 240 may generate a first tracking voltage reduced to ½ of the second tracking voltage of the second repetition process. During a fourth repetition process, the tracking voltage generator 240 may generate a second tracking voltage reduced to ½ of the first tracking voltage of the third repetition process. During a fifth repetition process, the tracking voltage generator 240 may generate a first tracking voltage reduced to ½ of the second tracking voltage of the fourth repetition process. During a sixth repetition process, the tracking voltage generator 240 may generate a second tracking voltage reduced to ½ of the first tracking voltage of the fifth repetition process (refer to FIG. 2D).

Figure 2B:
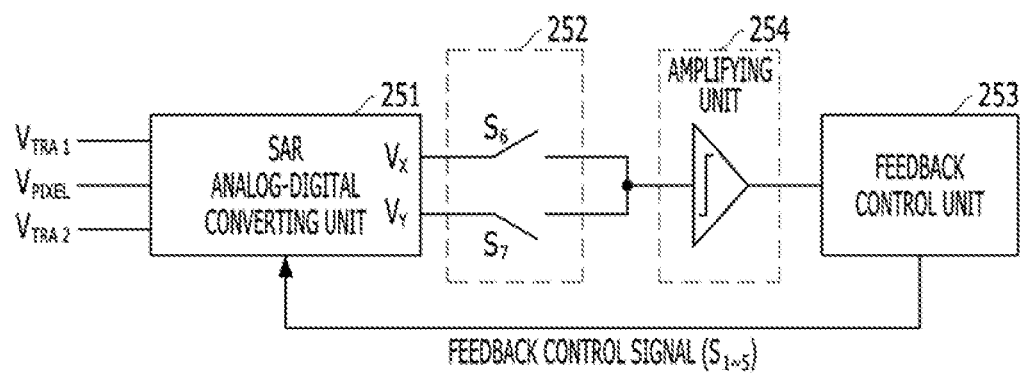
FIG. 2B is a diagram illustrating an exemplary configuration of the SAR analog-to-digital converter of FIG. 2A in accordance with an embodiment of the present invention.

The control unit 230 may output control signals for controlling sixth and seventh switches $S_6$ and $S_7$ of an output select unit 252 illustrated in FIG. 2B to the corresponding SAR analog-to-digital converters 250.

A SAR analog-to-digital converting system may be embodied using the tracking voltage generator 240 and the plurality of SAR analog-to-digital converters 250 as described. The SAR analog-to-digital converting system may be applied in various ways to various apparatuses including not only a CIS but also a display device or the like.

Hereinbelow an embodiment of the SAR analog-to-digital converter 250 will be described in detail with reference to FIG. 2B.

FIG. 2B is a diagram illustrating the SAR analog-to-digital converter 250 of FIG. 2A in accordance with an embodiment.

Referring to FIG. 2B, the SAR analog-to-digital converter 250 may include a SAR analog-to-digital converting unit 251, an output select unit 252, and a feedback control unit 253. The SAR analog-to-digital converting unit 251 is suitable for analog-to-digital converting a pixel signal $V_{pixel}$ (i.e., an input signal) by repeatedly performing N times a process of comparing the pixel signal received from the pixel array 210 with a tracking voltage generated by the tracking voltage generator 240 and modulating the pixel signal. The output select unit 252 is suitable for selecting an output signal from the SAR analog-to-digital converting unit 251 according to a control signal (e.g., a control signal for switches $S_6$ or $S_7$) generated by the control unit 230. The feedback control unit 253 is suitable for outputting a feedback control signal for controlling the switches to the SAR analog-to-digital converting unit 251 according to the output signal selected by the output select unit 252.

The SAR analog-to-digital converter 250 may further include an amplifying unit 254 suitable for amplifying an output signal selected by the output select unit 252 and transmitting the amplified output signal to the feedback control unit 253.

The output select unit 252 may include the sixth switch $S_6$ and the seventh switch $S_7$. The sixth switch $S_6$ is suitable for selecting a first output signal $V_X$ generated by the SAR analog-to-digital converting unit 251 according to a control signal generated by the control unit 230 for controlling the sixth switch $S_6$. The seventh switch $S_7$ is suitable for selecting a second output signal $V_Y$ generated by the SAR analog-to-digital converting unit 251 according to a control signal generated by the control unit 230 for controlling the seventh switch $S_7$.

The feedback control unit 253 may check a signal selected and outputted by the output select unit 252 and output first to fifth switch control signals for controlling first to fifth switches $S_1$ to $S_5$ of the SAR analog-to-digital converting unit 251.

The above-described SAR analog-to-digital converter 250 may be applied in various ways to various apparatuses including not only a CIS but also a display device or the like Hereinbelow, an example of the SAR analog-to-digital converting unit 251 will be described in detail with reference to FIG. 2C.

Figure 2C:
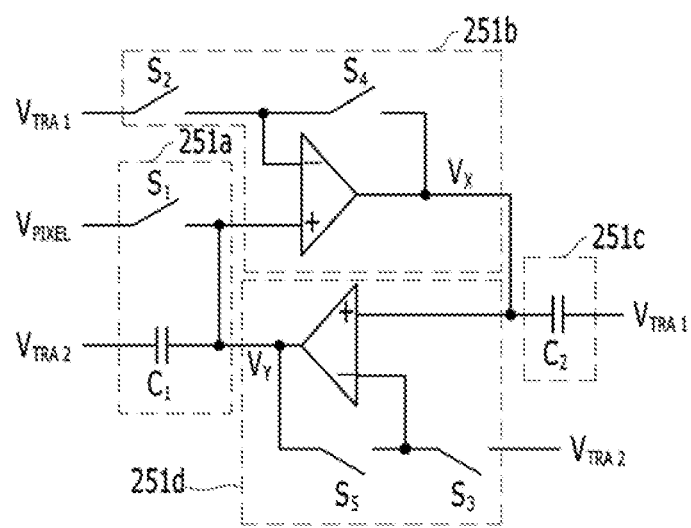
FIG. 2C is a diagram illustrating a SAR analog-to-digital converting unit of FIG. 2B in accordance with an embodiment of the present invention.
Figure 2D:
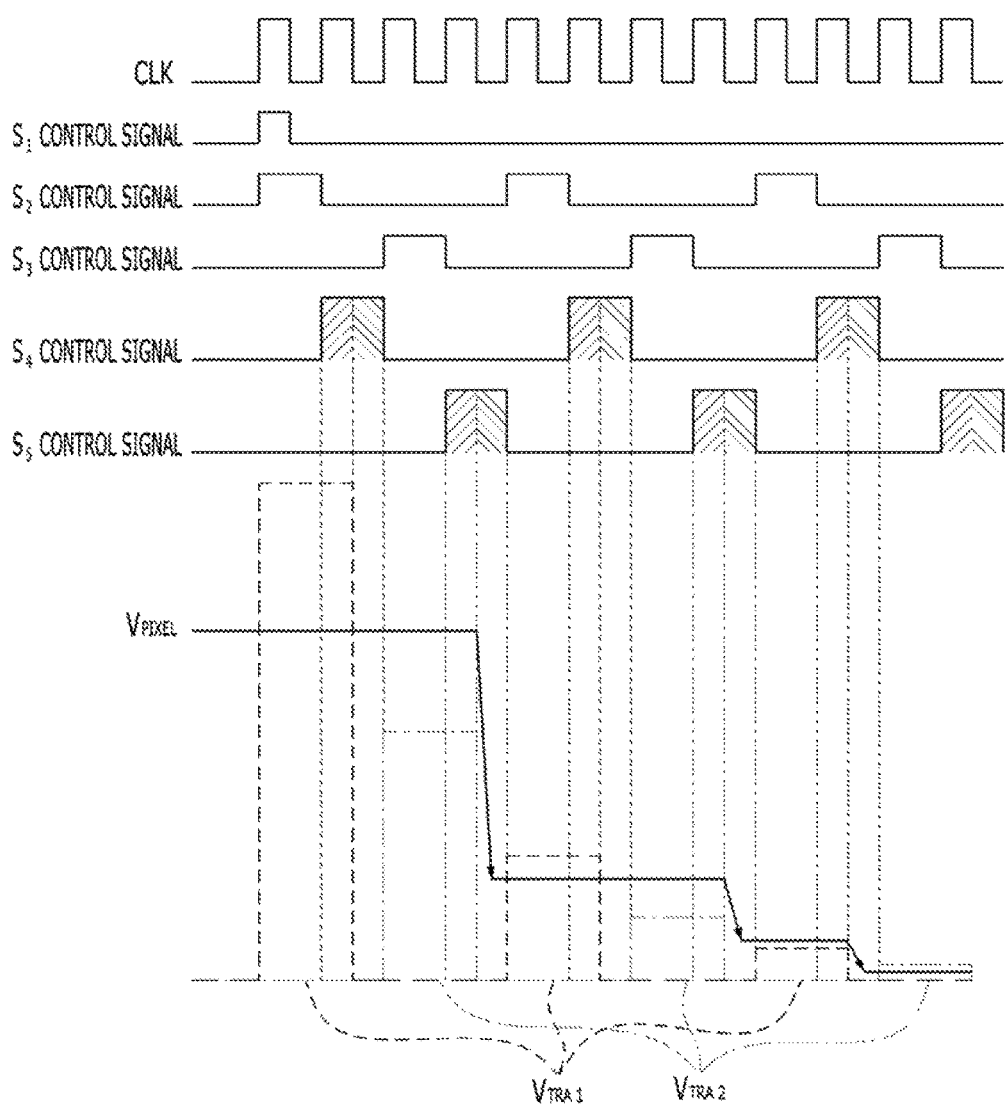
FIG. 2D is a diagram illustrating a timing waveform, a tracking voltage waveform, and a pixel signal modulation waveform of the SAR analog-to-digital converting unit of FIG. 2C in accordance with an embodiment of the present invention.

FIG. 2C is a diagram illustrating the SAR analog-to-digital converting unit 251 of FIG. 2B in accordance with an embodiment of the present invention. FIG. 2D is a diagram illustrating a timing waveform, a tracking voltage waveform, and a pixel signal modulation waveform of the SAR analog-to-digital converting unit 251 of FIG. 2C in accordance with an embodiment of the present invention.

Referring to FIG. 2C, the SAR analog-to-digital converter 251 may include a first storage block 251a, a first comparison block 251b, a second storage block 251c and a second comparison block 251d. The first storage block 251a is suitable for sampling a pixel signal $V_{PIXEL}$ (i.e., pixel voltage) from the pixel array 210 and storing it. The first comparison block 251b is suitable for comparing the pixel signal of the first storage block 251a with a first tracking voltage provided from the tracking voltage generator 240 and outputting a first comparison result, and modulating or retaining the pixel signal of the first storage block 251a according to a feedback control signal provided from the feedback control unit 253 depending on the first comparison result. The second storage block 251c is suitable for storing the pixel signal modulated or retained by the first comparison block 251b. The second comparison block 251d is suitable for comparing the pixel signal of the second storage block 251c with a second tracking voltage provided from the tracking voltage generator 240 and outputting a second comparison result, and modulating or retaining the pixel signal of the second storage block 251c according to a feedback control signal provided from the feedback control unit 253 depending on the second comparison result, and then storing the pixel signal in the first storage block 251a. The first and second comparison blocks 251b and 251d and the second storage block 251c are repeatedly operated N/2 times using first and second tracking voltages which are modulated (i.e., reduced) during each of the processes that are successively performed, and thus make the pixel signal be converged on an N-th tracking voltage while being modulated.

The first storage block 251a may be embodied using the first switch $S_1$ and a first capacitor $C_1$. The first comparison block 251b may be embodied using one comparator, and the second and fourth switches $S_2$ and $S_4$. The second storage block 251c may be embodied using a second capacitor $C_2$. The second comparison block 251d may be embodied using one comparator and the third and fifth switches $S_3$ and $S_5$.

As such, the SAR analog-to-digital converting unit 251 may be embodied using the two comparators, the two capacitors $C_1$ and $C_2$, and the five switches $S_1$ to $S_5$, but it may be embodied in various other ways. The two comparators may be operated as comparators or buffers depending on connection states of the first to fifth switches $S_1$ to $S_5$.

Hereinafter, the operation of the SAR analog-to-digital converter 250 and the consequential operation of the SAR analog-to-digital converting unit 251 will be described.

First, a first process is performed which includes comparing a pixel signal $V_{PIXEL}$ with a first tracking voltage $V_{TRA1}$, and modulating or retaining the pixel signal depending on a first comparison result. That is, there is performed the first process of sampling and storing the pixel signal in the first storage block 251a, comparing it with the first tracking voltage of the first repetition process, modulating (i.e., reducing) or retaining the pixel signal under control depending on the first comparison result in the first comparison block 251b, and then storing the modulated or retained pixel signal in the second storage block 21c.

Thereafter, in the second comparison unit 251d, there is performed a second process of comparing the pixel signal modulated or retained during the first process with a second tracking voltage, and modulating or retaining, depending on a second comparison result, the pixel signal modulated or retained during the first process. That is, there is performed the second process of comparing the pixel signal modulated or retained during the first process with the second tracking voltage of the second repetition process, modulating (i.e., reducing) or retaining again the pixel signal modulated or retained during the first process under control depending on the second comparison result, and then storing the modulated or retained pixel signal in the first storage unit 251a.

Subsequently, the first process is reperformed using the pixel signal modulated or retained during the second process and a first tracking voltage of a third repetition process.

As such, the SAR analog-to-digital conversion having N-bit resolution is performed in such a way that the pixel signal is reduced (i.e., modulated) by repeatedly performing the first and second processes N/2 times successively using tracking voltages of third to N-th repetition processes and thus eventually converges on the tracking voltage.

Hereinbelow, the operation of the SAR analog-to-digital converting unit 251 will be described in detail with reference to FIGS. 2C and 2D. Here, the term "CLK" of FIG. 2D refers to a system clock of a CIS to which the SAR analog-to-digital converting unit 251 is applied, for example.

First, the first process will be described. In a state in which the third to fifth switches $S_3$ to $S_5$ are turned off and the second switch $S_2$ is turned on according to a control signal for the switch $S_2$, if the first switch $S_1$ is turned on according to a control signal for the switch $S_1$ (e.g., high level signal), the SAR analog-to-digital converting unit 251 samples a pixel signal $V_{PIXEL}$ (i.e., pixel voltage) and stores it in the first capacitor $C_1$.

Thereafter, if the first switch $S_1$ is turned off according to a control signal for the switch $S_1$ (e.g., low level signal), the SAR analog-to-digital converting unit 251 compares a voltage value (i.e., pixel signal) that has been sampled and stored in the first capacitor $C_1$ with a first tracking voltage $V_{TRA1}$ of the first repetition process, and outputs a first comparison result value $V_X$. If the first comparison result value $V_X$ is a high level, the feedback control unit 253 turns on the fourth switch $S_4$ through a control signal for the switch $S_4$ (e.g., high level signal).

Then, the pixel signal (i.e., input signal) is moved (that is, reduced) in voltage level by the first tracking voltage $V_{TRA1}$ of the first repetition process, and thereafter stored in the second capacitor $C_2$ of the second storage block 251c as a changed voltage value.

If the first comparison result value $V_X$ is a low level, the feedback control unit 253 turns on the fourth switch $S_4$ through a control signal for the switch $S_4$ (e.g., high level signal) after the second switch $S_2$ is turned off according to a control signal for the switch $S_2$ (e.g., low level signal) and the first tracking voltage $V_{TRA1}$ of the first repetition process is converted into a low level.

Then, the pixel signal is stored in the second capacitor $C_2$ without a voltage level change.

Next, the second process will be described. If the fourth switch $S_4$ is turned off according to a control signal for the switch $S_4$ (e.g., low level signal) and the third switch $S_3$ is turned on according to a control signal for the switch. $S_3$ (e.g., high level signal), the SAR analog-to-digital converting unit 251 compares the voltage value (i.e., pixel signal) that has been stored in the second capacitor $C_2$ with the second tracking voltage $V_{TRA2}$ of the second repetition process and outputs a second comparison result value $V_Y$. If the second comparison result value $V_Y$ is a high level, the feedback control unit 253 turns on the fifth switch $S_5$ through a control signal for the switch $S_5$ (e.g., high level signal).

Then, the voltage level of the pixel signal (i.e., input signal) that has been stored in the second capacitor $C_2$ is reduced by the second tracking voltage $V_{TRA1}$ of the second repetition process, and thereafter the reduced voltage pixel signal stored in the first capacitor $C_1$.

If the second comparison result value $V_Y$ is a low level, the feedback control unit 253 turns on the fifth switch $S_5$ through a control signal for the switch $S_5$ (e.g., high level signal) after the third switch $S_3$ is turned off according to a control signal for the switch $S_3$ low level signal) and the second tracking voltage $V_{TRA2}$ of the second repetition process is converted into a low level.

Then, the voltage value (i.e., pixel signal) that has been stored in the second capacitor $C_2$ is stored in the first capacitor $C_1$ without a voltage level change.

Subsequently, the first process is repeated using the pixel signal stored during the second process and the first tracking voltage of the third repetition process.

As such, the N-bit data conversion is performed in such a way that the pixel signal is reduced (i.e., modulated) by repeatedly performing the first and second processes N/2 times successively using tracking voltages of third to N-th repetition processes and eventually converges on the tracking voltage.

The N-bit SAR analog-to-digital converter (ADC) is, for example, an apparatus which may reduce a counting number to 5.37% (11/2048) when the operation is performed with an 11-bit resolution, and has not only advantageous effects of low power consumption, reduced switching noise, and a reduced size of peripheral circuit, but also an effect of markedly reducing operation speed of a product, compared to the single-slope analog-to-digital converter.

For example, the counting operation speed of the single-slope analog-to-digital converting device (ADC) currently ranges from approximately 600 MHz to approximately 800 MHz, but if the present disclosure is used, the counting operation speed may be markedly reduced to a range from 10 MHz to 30 MHz. Thereby, the characteristics of the analog-to-digital converter may be improved, and problems such as noise caused by high-speed switching in the entire chip operation may be solved.

Various embodiments use a structure of tracking a data value while modulating an input signal according to a calculation result, thus making it possible to perform N-bit data conversion using a single tracking voltage generator rather than including an independent digital-analog converter for each column line.

That is, in accordance with various embodiments, data conversion is performed by repeatedly performing, by desired resolution, a process of converting or storing data depending on operating phases using two comparators. Thereby, power consumption may be reduced, switching noise may be reduced, the size of peripheral circuit may be reduced, and operating speed itself may be markedly reduced.

Although various embodiments have been described for illustrative purposes, it will be apparent to those skilled in the art that various changes and modifications may be made without departing from the spirit and scope of the disclosure as defined in the following claims.

What is claimed is:

1. A complementary metal oxide semiconductor (CMOS) image sensor comprising:
a pixel array suitable for outputting a pixel signal corresponding to incident light;
a row decoder suitable for selecting and controlling pixels in the pixel array by row lines;
a tracking voltage generator suitable for generating a tracking voltage;
a plurality of successive approximation register (SAR) analog-to-digital converters suitable for analog-to-digital converting a pixel signal by repeatedly performing N times (where N is a natural number representing desired resolution) a process of comparing the pixel signal generated by the pixel array with the tracking voltage generated by the tracking voltage generator and modulating the pixel signal; and
a control unit suitable for controlling operations of the row decoder, the tracking voltage generator, and the plurality of SAR analog-to-digital converters.

2. The CMOS image sensor of claim 1, wherein, during each of the repeated processes, the tracking voltage generator generates a tracking voltage modulated from a tracking voltage of a preceding repetition process at a predetermined rate.

3. The CMOS image sensor of claim 1,
wherein the tracking voltage generator generates a first tracking voltage having a predetermined voltage level during a first repetition process, and
wherein the tracking voltage generator performs a process of generating a second tracking voltage modulated from the first tracking voltage of the first repetition process at a predetermined rate during a second repetition process, generating a first tracking voltage modulated from the second tracking voltage of the second repetition process at the predetermined rate, and repeatedly performing the process by an N-th repetition process.

4. The CMOS image sensor of claim 1, wherein each of the SAR analog-to-digital converter comprises:
an SAR analog-to-digital converting unit suitable for analog-to-digital converting the pixel signal by repeatedly performing N times a process of comparing the pixel signal generated by the pixel array with the tracking voltage generated by the tracking voltage generator and modulating the pixel signal;
an output select unit suitable for selecting an output signal from the SAR analog-to-digital converting unit according to a control signal generated by the control unit; and
a feedback control unit suitable for outputting a feedback control signal to the SAR analog-to-digital converting unit according to the output signal selected by the output select unit.

5. The CMOS image sensor of claim 4, wherein each of the SAR analog-to-digital converter further comprises
an amplifying unit suitable for amplifying the output signal selected by the output select unit and transmitting the output signal to the feedback control unit.

6. The CMOS image sensor of claim 4, wherein the SAR analog-to-digital converting unit comprises:
a first storage block suitable for sampling the pixel signal from the pixel array and storing the pixel signal;
a first comparison block suitable for comparing the pixel signal of the first storage block with the first tracking voltage provided from the tracking voltage generator and outputting a first comparison result, and modulating or retaining the pixel signal of the first storage block according to a feedback control signal provided from the feedback control unit depending on the first comparison result;
a second storage block suitable for storing the pixel signal modulated or retained by the first comparison block; and
a second comparison block suitable for comparing the pixel signal of the second storage block with the second tracking voltage provided from the tracking voltage generator and outputting a second comparison result, and modulating or retaining the pixel signal of the second storage block according to a feedback control signal provided from the feedback control unit depending on the second comparison result and storing the modulated or retained pixel signal in the first storage block,
wherein the first and second comparison blocks and the second storage block are repeatedly operated N/2 times using first and second tracking voltages modulated during each of the repetition processes.

7. A successive approximation register (SAR) analog-to-digital converting system comprising:

a tracking voltage generator suitable for generating a tracking voltage; and a plurality of SAR analog-to-digital converter suitable for analog-to-digital converting an input signal by repeatedly performing N times (where N is a natural number representing desired resolution) a process of comparing the input signal with the tracking voltage generated by the tracking voltage generator and modulating the input signal, wherein, during each of repetition processes which are successively performed, the tracking voltage generator generates a tracking voltage modulated from a tracking voltage of a preceding repetition process at a predetermined rate.

8. The SAR analog-to-digital converting system of claim 7, wherein the tracking voltage generator generates a first tracking voltage having a predetermined voltage level during a first repetition process, and wherein the tracking voltage generator performs a process of generating a second tracking voltage modulated from the first tracking voltage of the first repetition process at a predetermined rate during a second repetition process, and generating a first tracking voltage modulated from the second tracking voltage of the second repetition process at the predetermined rate, and repeatedly performs the process to an N-th repetition process.

9. The SAR analog-to-digital converting system of claim 7, wherein each of the SAR analog-to-digital converters comprises:

an SAR analog-to-digital converting unit suitable for analog-to-digital converting the input signal by repeatedly performing N times a process of comparing the input signal with the tracking voltage generated from the tracking voltage generator and modulating the input signal;

an output select unit suitable for selecting an output signal from the SAR analog-to-digital converting unit; and a feedback control unit suitable for outputting a feedback control signal to the SAR analog-to-digital converting unit according to the output signal selected by the output select unit.

10. The SAR analog-to-digital converting system of claim 9, wherein the SAR analog-to-digital converting unit comprises:

a first storage block suitable for sampling and storing the input signal;

a first comparison block suitable for comparing the input signal of the first storage block with the first tracking voltage provided from the tracking voltage generator and outputting a first comparison result, and modulating or retaining the input signal of the first storage block according to a feedback control signal provided from the feedback control unit depending on the first comparison result;

a second storage block suitable for storing the input signal modulated or retained in the first comparison block; and a second comparison block suitable for comparing the input signal of the second storage block with the second tracking voltage provided from the tracking voltage generator and outputting a second comparison result, and modulating or retaining the input signal of the second storage block according to a feedback control signal provided from the feedback control unit depending on the second comparison result and storing the modulated or retained input signal in the first storage block, wherein the first and second comparison blocks and the second storage block are repeatedly operated N/2 times using first and second tracking voltages modulated during each of the repetition processes.

11. A successive approximation register (SAR) analog-to-digital converter comprising:

an SAR analog-to-digital converting unit suitable for analog-to-digital converting an input signal by repeatedly performing N times (where N is a natural number representing desired resolution) a process of comparing the input signal with a tracking voltage and modulating the input signal;

an output select unit suitable for selecting an output signal from the SAR analog-to-digital converting unit; and a feedback control unit suitable for outputting a feedback control signal to the SAR analog-to-digital converting unit according to the output signal selected by the output select unit.

12. The SAR analog-to-digital converter of claim 11, wherein the SAR analog-to-digital converting unit comprises:

a first storage block suitable for sampling and storing the input signal;

a first comparison block suitable for comparing the input signal of the first storage block with a first tracking voltage and outputting a first comparison result, and modulating or retaining the input signal of the first storage block according to a feedback control signal provided from the feedback control unit depending on the first comparison result;

a second storage block suitable for storing the input signal modulated or retained in the first comparison block; and a second comparison block suitable for comparing the input signal of the second storage block with a second tracking voltage and outputting a second comparison result, and modulating or retaining the input signal of the second storage block according to a feedback control signal provided from the feedback control unit depending on the second comparison result and storing the modulated or retained input signal in the first storage block, wherein the first and second comparison blocks and the second storage block are repeatedly operated N/2 times using first and second tracking voltages modulated during each of the repetition processes.

* * * * *